US011948783B2

(12) United States Patent
Ponnekanti et al.

(10) Patent No.: US 11,948,783 B2
(45) Date of Patent: Apr. 2, 2024

(54) DYNAMIC PHASED ARRAY PLASMA SOURCE FOR COMPLETE PLASMA COVERAGE OF A MOVING SUBSTRATE

(71) Applicant: Applied Materials, Inc., Santa Clara, CA (US)

(72) Inventors: Hari Ponnekanti, San Jose, CA (US); Mukund Srinivasan, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1158 days.

(21) Appl. No.: 15/813,877

(22) Filed: Nov. 15, 2017

(65) Prior Publication Data

US 2018/0138023 A1 May 17, 2018

Related U.S. Application Data

(60) Provisional application No. 62/422,390, filed on Nov. 15, 2016.

(51) Int. Cl.
*H01J 37/32* (2006.01)
*C23C 16/458* (2006.01)
*C23C 16/505* (2006.01)
*C23C 16/509* (2006.01)
(Continued)

(52) U.S. Cl.
CPC .... *H01J 37/32935* (2013.01); *C23C 16/4584* (2013.01); *C23C 16/505* (2013.01); *C23C 16/509* (2013.01); *C23C 16/511* (2013.01); *C23C 16/52* (2013.01); *H01J 37/32449* (2013.01); *H01J 37/32715* (2013.01);
(Continued)

(58) Field of Classification Search
None
See application file for complete search history.

(56) References Cited

U.S. PATENT DOCUMENTS

| 2003/0116089 A1* | 6/2003 | Walther | H01J 37/20 118/723 E |
| 2010/0108491 A1* | 5/2010 | Yoon | H01L 21/02063 204/164 |

(Continued)

FOREIGN PATENT DOCUMENTS

| JP | 2006019067 A | 1/2006 |
| KR | 20050019889 A | 3/2005 |

(Continued)

OTHER PUBLICATIONS

PCT International Preliminary Report on Patentability in PCT/US2017/061766 dated May 21, 2019, 9 pages.

(Continued)

*Primary Examiner* — Karla A Moore
(74) *Attorney, Agent, or Firm* — Servilla Whitney LLC

(57) ABSTRACT

Apparatus and methods to process a substrate comprising a gas distribution assembly comprising a plasma process region with an array of individual plasma sources. A controller is connected to the array of individual plasma sources and the substrate support. The controller is configured monitor the position of the at least one substrate and provide or disable power to the individual plasma sources based on the position of the substrate relative to the individual plasma sources.

16 Claims, 8 Drawing Sheets

(51) Int. Cl.
   *C23C 16/511* (2006.01)
   *C23C 16/52* (2006.01)
(52) U.S. Cl.
   CPC .................. *H01J 2237/202* (2013.01); *H01J 2237/20214* (2013.01); *H01J 2237/3321* (2013.01)

(56) References Cited

U.S. PATENT DOCUMENTS

| | | | |
|---|---|---|---|
| 2012/0125258 A1* | 5/2012 | Lee | C23C 16/45536 118/719 |
| 2013/0042811 A1 | 2/2013 | Shanker et al. | |
| 2013/0047923 A1* | 2/2013 | Kato | C23C 16/4585 118/723 AN |
| 2013/0210238 A1* | 8/2013 | Yudovsky | H01L 21/02104 438/758 |
| 2013/0276983 A1* | 10/2013 | Park | C23C 16/4584 156/345.34 |
| 2014/0030444 A1 | 1/2014 | Swaminathan et al. | |
| 2015/0007774 A1* | 1/2015 | Iwasaki | C23C 16/45542 118/723 R |
| 2015/0255258 A1* | 9/2015 | Nozawa | H01J 37/32779 156/345.42 |
| 2015/0299855 A1 | 10/2015 | Yudovsky et al. | |
| 2016/0053376 A1 | 2/2016 | Nam et al. | |
| 2017/0067156 A1* | 3/2017 | Leeser | H01J 37/32788 |
| 2017/0167019 A1* | 6/2017 | Hasebe | H01J 37/3244 |

FOREIGN PATENT DOCUMENTS

| | | |
|---|---|---|
| KR | 20070093820 A | 9/2007 |
| KR | 20140036224 A | 3/2014 |
| KR | 20140091007 A | 7/2014 |
| KR | 20150016983 A | 2/2015 |
| KR | 20150025903 A | 3/2015 |
| WO | WO-2011125471 A1 * 10/2011 | ........ H01J 37/32192 |

OTHER PUBLICATIONS

PCT International Search Report and Written Opinion in PCT/US2017/061766 dated Feb. 23, 2018, 13 pages.
Translation of JP2006019067, 21 pages.

* cited by examiner

DYNAMIC PHASED ARRAY PLASMA SOURCE FOR COMPLETE PLASMA COVERAGE OF A MOVING SUBSTRATE

CROSS-REFERENCE TO RELATED APPLICATIONS

This application claims priority to U.S. Provisional Application No. 62/422,390, filed Nov. 15, 2016, the entire disclosure of which is hereby incorporated by reference herein.

TECHNICAL FIELD

The present disclosure relates generally to apparatus for depositing thin films. In particular, the disclosure relates to apparatus for depositing thin films using a dynamic phased array plasma source.

BACKGROUND

Spatial plasma enhanced atomic layer deposition provide a combination of atomic layer deposition/epitaxy performance with productivity offered by substrate movement through a reaction zone. This typically involves the substrate moving in and out of a plasma zone so that as the substrate enters or exits the zone only a part of the substrate is exposed to the plasma. This partial exposure can result in charge related damage to sensitive devices as there is a charge buildup across the substrate.

Therefore, there is a need in the art for apparatus and methods to expose the entire substrate to a plasma at the same time.

SUMMARY

One or more embodiments of the disclosure are directed to processing chambers comprising a gas distribution assembly with a plasma process region with an array of individual plasma sources. A substrate support supports and moves at least one substrate adjacent the gas distribution assembly. A controller is connected to the array of individual plasma sources and the substrate support. The controller is configured monitor a position of the at least one substrate and provide or disable power to the individual plasma sources.

Additional embodiments of the disclosure are directed to processing chambers comprising a circular gas distribution assembly comprising a thermal process region and a plasma process region with an array of individual plasma sources. The plasma process region comprises greater than or equal to about half of a circle. Each of the individual plasma sources has an independent width in the range of about 1 cm to about 5 cm. A susceptor assembly is positioned adjacent the circular gas distribution assembly and has a top surface with a plurality of recesses to support a plurality of substrates. The susceptor assembly is rotatable about a central axis to move the substrates in an arcuate path adjacent the gas distribution assembly. A controller is connected to the array of individual plasma sources and the susceptor assembly. The controller is configured to monitor a position of the recesses in the susceptor assembly and provide power or disable power to each of the individual plasma sources. The controller is configured to provide power to individual plasma sources over a substrate after the substrate has completely entered the plasma process region and to provide power to individual plasma sources ahead of the substrate along the path and disable power to individual plasma sources behind the substrate as the substrate moves along the path.

Further embodiments of the disclosure are directed to processing methods comprising positioning a substrate on a substrate support located adjacent a gas distribution assembly comprising a plasma process region with an array of individual plasma sources. The position of the substrate relative to the array of individual plasma sources is monitored. Individual plasma sources adjacent the substrate are powered during movement so that the entire substrate is exposed to plasma at the same time and disabling power to individual plasma sources not adjacent the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Figure 1:
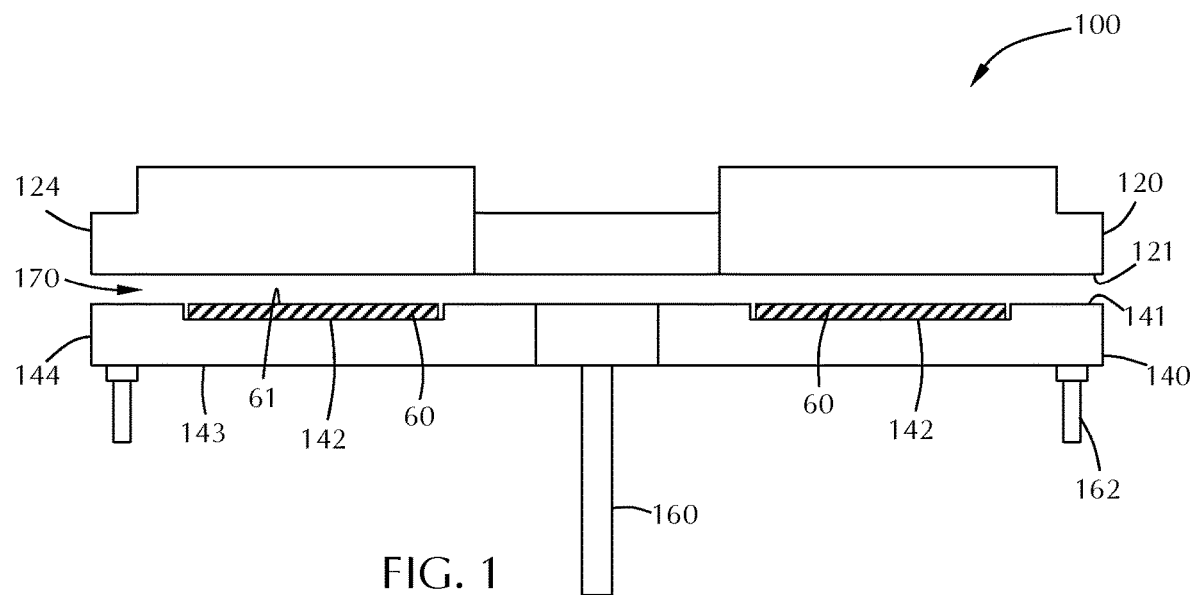
FIG. 1 shows a cross-sectional view of a batch processing chamber in accordance with one or more embodiment of the disclosure.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 2:
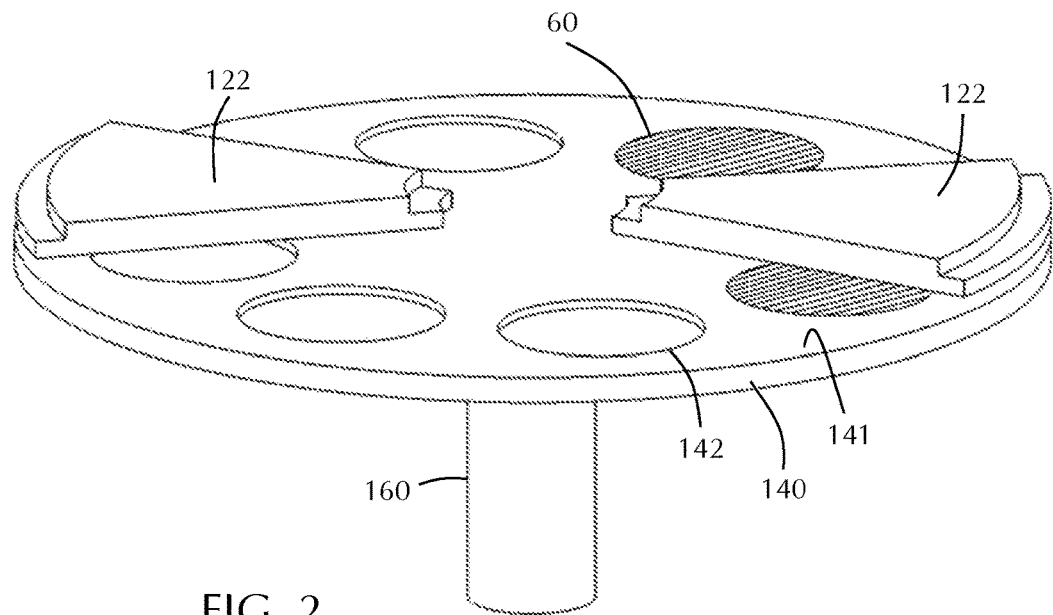
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within 0.5 mm, ±0.4 mm, ±0.35 mm, ±0.30 mm, ±0.25 mm, ±0.20 mm, ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
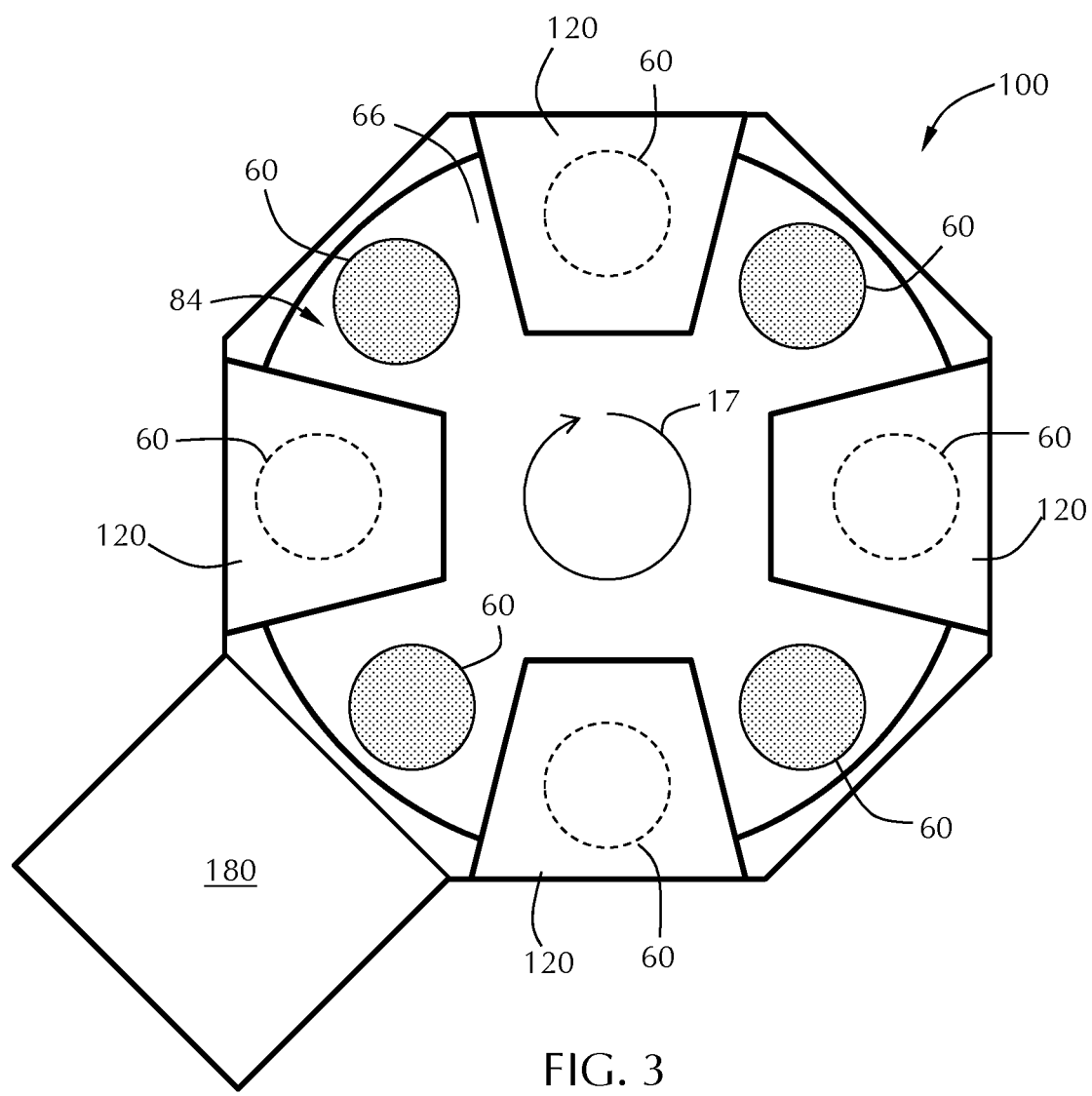
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 120 includes eight process regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
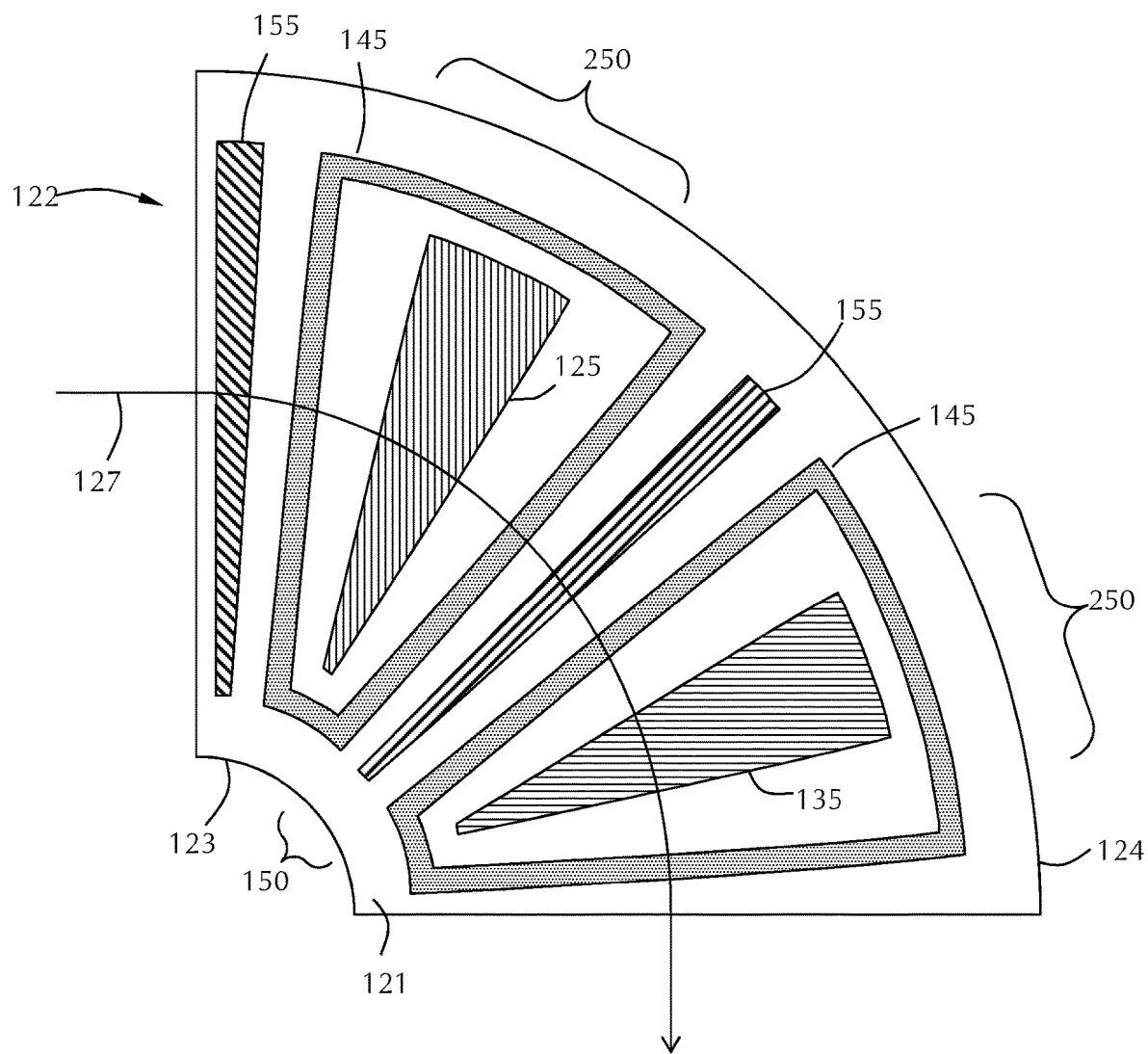
FIG. 4 shows a schematic view of a portion of a wedge shaped gas distribution assembly for use in a batch processing chamber in accordance with one or more embodiment of the disclosure.
Figure 5:
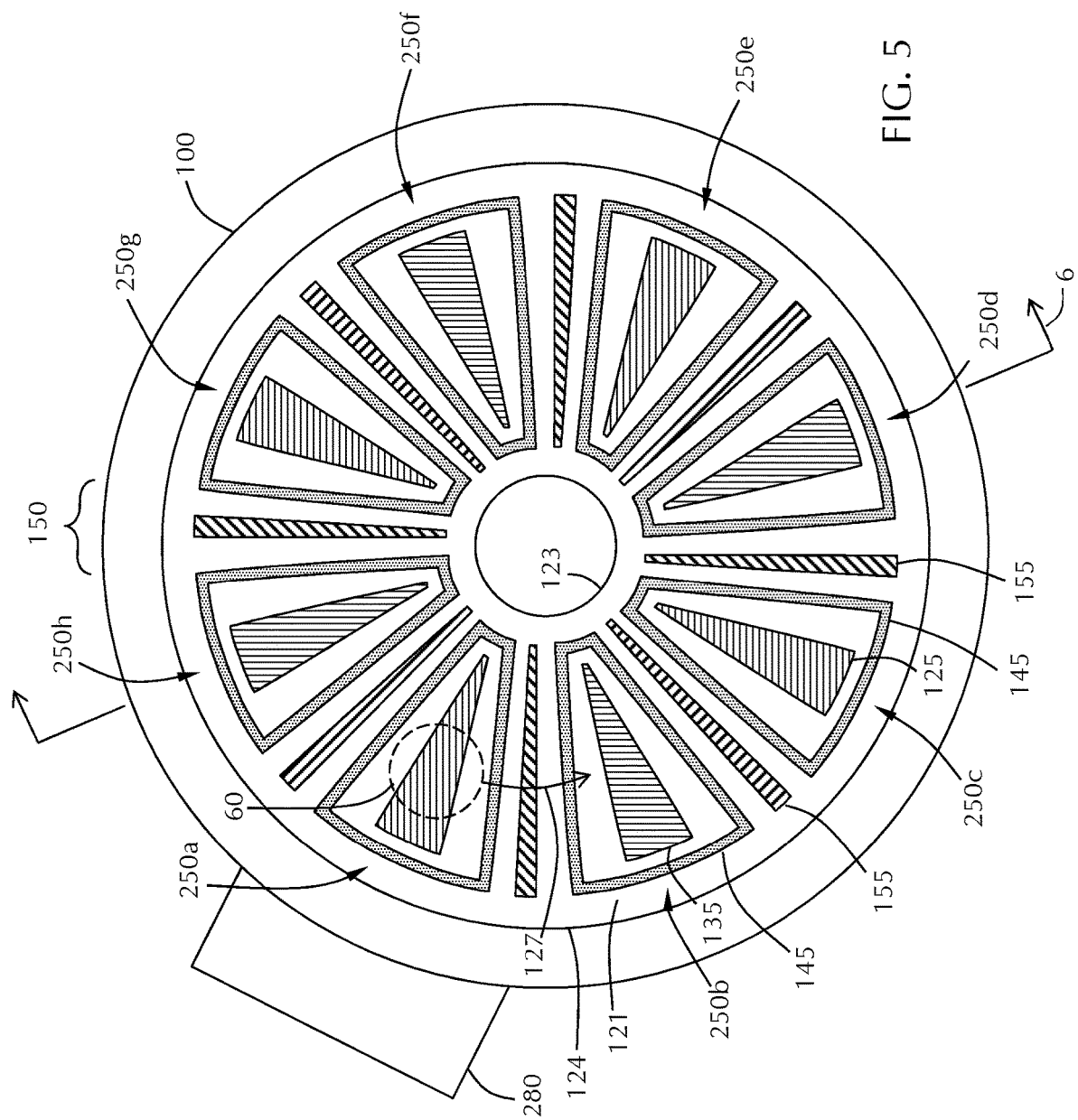
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145, 155 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first reactive gas 125 and the second reactive gas 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of process regions 250. The process regions are roughly defined around the individual gas ports 125, 135 with the gas curtain 150 between 250. The embodiment shown in FIG. 5 makes up eight separate process regions 250 with eight separate gas curtains 150 between. A processing chamber can have at least two process regions. In some embodiments, there are at least three, four, five, six, seven, eight, nine, 10, 11 or 12 process regions.

During processing a substrate may be exposed to more than one process region 250 at any given time. However, the portions that are exposed to the different process regions will have a gas curtain separating the two. For example, if the leading edge of a substrate enters a process region including the second gas port 135, a middle portion of the substrate will be under a gas curtain 150 and the trailing edge of the substrate will be in a process region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution plate 120. The substrate 60 is loaded via the factory interface 280 into the processing chamber 100 onto a substrate support or susceptor assembly (see FIG. 3). The substrate 60 can be shown positioned within a process region because the substrate is located adjacent the first reactive gas port 125 and between two gas curtains 150*a*, 150*b*. Rotating the substrate 60 along path 127 will move the substrate counterclockwise around the processing chamber 100. Thus, the substrate 60 will be exposed to the first process region 250*a* through the eighth process region 250*h*, including all process regions between.

Embodiments of the disclosure are directed to processing methods comprising a processing chamber 100 with a plurality of process regions 250*a*-250*h* with each process region separated from an adjacent region by a gas curtain 150. For example, the processing chamber shown in FIG. 5. The number of gas curtains and process regions within the processing chamber can be any suitable number depending on the arrangement of gas flows. The embodiment shown in FIG. 5 has eight gas curtains 150 and eight process regions 250*a*-250*h*.

Embodiments of the disclosure allow for plasma to be turned on or off over the entire substrate at the same time while the substrate is moving. Some embodiments of the disclosure include an nn array plasma source (multiple electrodes) that can be powered individually or in zones. The substrate moving mechanism of some embodiments has an accurate positional feedback system for each substrate.

According to some embodiments, after a substrate has entered the region under the array completely, the sources covering the entire substrate ignite at once. As the substrate moves, the positional information is communicated to the plasma array controller that ignites the plasma sources just in front of the moving substrate while turning off the electrodes just behind the moving substrate. Once the next substrate is completely under the array, the plasma lights up again. Similarly, on the way out of the process region, the array over the entire surface of the substrate turns off at once just before the leading edge of the substrate exits the plasma array region. Each substrate can be said to be "chasing" a plasma cloud while in the plasma array region with the plasma turning on and off on the whole substrate after each substrate enters the plasma array region completely or exits completely, respectively.

In some embodiments, the arrangement of the plasma array is linear or circular or any other shape configuration. The movement of the substrate can be one-way or oscillating. The length/size of the plasma array can be varied depending on, for example, plasma exposure time to be used, the number of substrate in the process chamber and/or the speed of the substrate movement.

Figure 6:
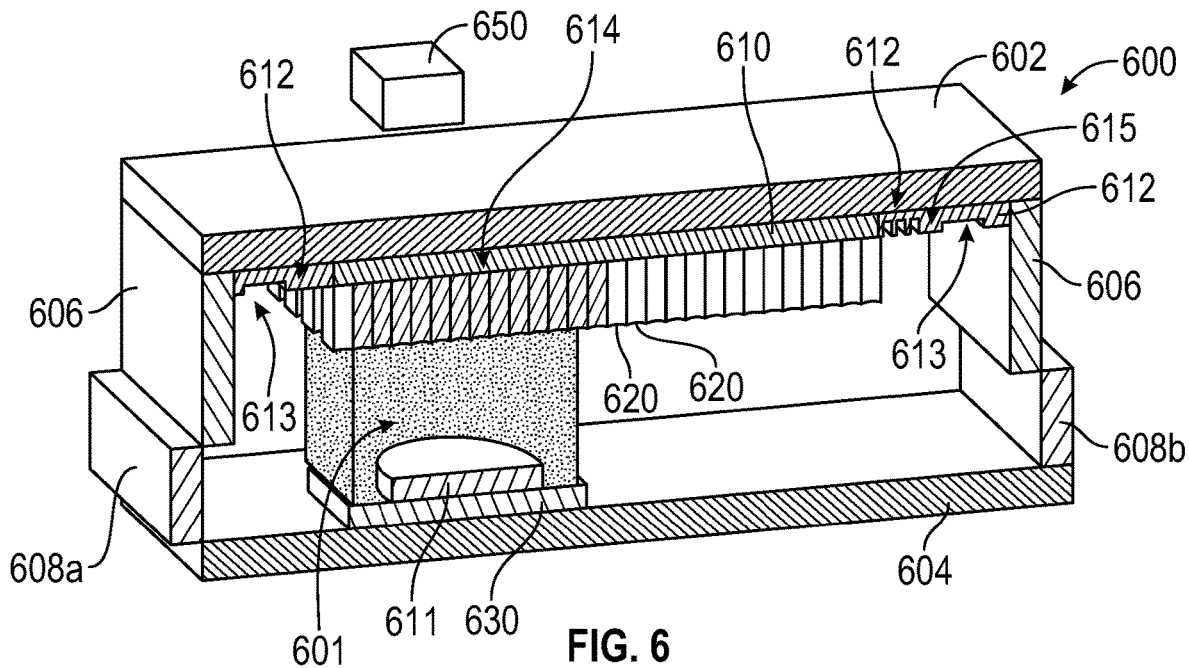
FIG. 6 shows a cross-sectional view of a processing chamber in accordance with one or more embodiment of the disclosure.

Referring to FIG. 6, one or more embodiments of the disclosure are directed to a processing chamber 600. The processing chamber has a top 602, a bottom 604 and sides 606. The processing chamber 600 includes a gas distribution assembly 610 and a substrate support 630.

The gas distribution assembly 610 can have a thermal process region 612 and a plasma process region 614. In the thermal process region 612, one or more reactive gases can be flowed through port 613 into the process region 601 of the processing chamber 600. The process region 601 is defined as the space between the substrate 611 and the gas distribution assembly 610. In the embodiment shown, the gas distribution assembly 610 has a plasma process region 614 in the middle with thermal process regions 612 on either side thereof. While two thermal process regions 612 are show, those skilled in the art will understand that there can be more or less than two. In some embodiments, the thermal process region 612 is separated from the plasma process region 614 by at least one gas curtain 615. The gas curtain 615 can be any combination of inert gases and/or vacuum ports to form a gaseous boundary isolating the plasma process region 614 from the thermal process region 612.

The processing chamber 600 includes a substrate support 630 which can be any component or combination of components capable of moving one or more substrate 611 through the process chamber 600 in a position adjacent the gas distribution assembly 610.

The gas distribution assembly 610 includes an array of individual plasma sources 620 in the plasma process region 614. Each of the individual plasma sources 620 can be any suitable plasma source that can generate a plasma in the process region 601.

Figure 7:
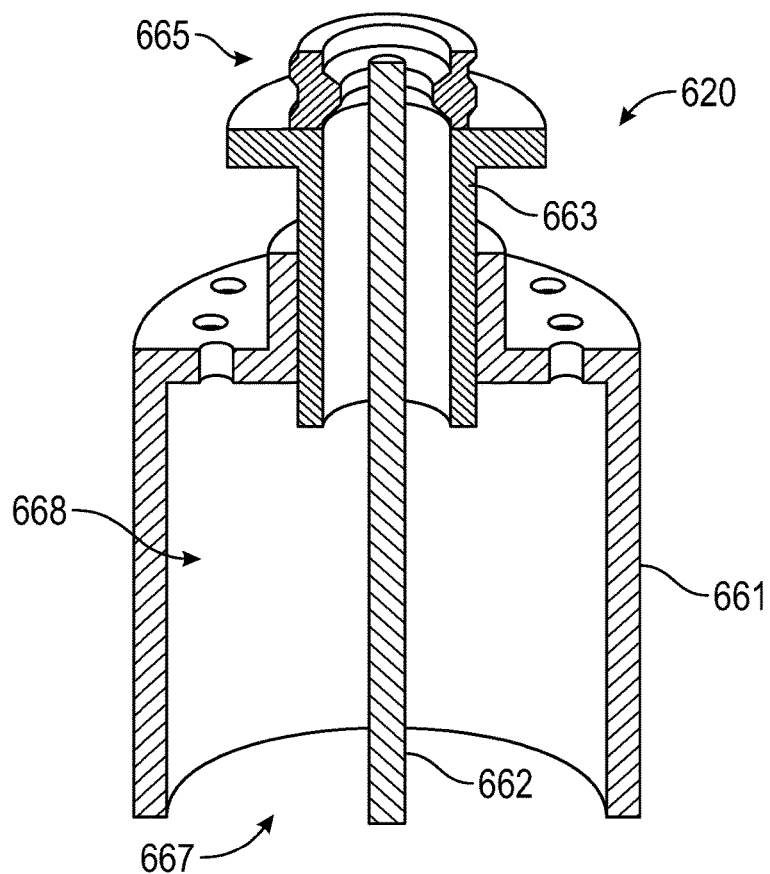
FIG. 7 shows a cross-sectional view of a plasma source in accordance with one or more embodiment of the disclosure.

FIG. 7 shows a cross-sectional view of an example of an individual plasma source 620 in accordance with one or more embodiment of the disclosure. While the source 620 shown has a generally cylindrical shape, it will be understood by those skilled in the art that the shape of the source 620 can be any suitable shape.

The source 620 shown has a housing 661 with a hot electrode 662 within. The housing 661 is spaced from the hot electrode 662 so that there is no electrical contact between the housing 661 and the hot electrode 662 so that the housing 661 can act as a return path for electrical current flowing through the hot electrode 662. Support structure 663 can contact both the hot electrode 662 and the housing 661 without providing an electrical path between the components. The support structure 663 can be made from any suitable material including, but not limited to, dielectrics. A connector 665 can be positioned on the source 620 to provide electrical power to the hot electrode 662 and to provide a return path for the housing 661. The connector 665 can be configured as a coaxial connection so that the power cable (not shown) can be a coaxial cable.

The distance between the hot electrode 662 and the housing 661, or other return electrode, can be any suitable distance. In the embodiment shown, the distance from the hot electrode 662 to the housing 661 is substantially the same around the perimeter of the housing 661. Having the distance between the hot electrode 662 and the return path remain consistent may help provide uniform plasma within the source 620. In some embodiments, the shape of the hot electrode 662 is substantially the same as the shape of the housing 661 or the return electrode if not the housing 661.

For example, a square shaped housing might have a square shaped electrode or a hexagonal housing might have a hexagonal electrode.

An opening 667 in the bottom of the source 620 allows a gaseous species within the cavity 668 of the housing to flow to the process region 601 of the processing chamber 600. The width of the opening 667 can be used to define the width of the plasma source 620 and is measured as the average distance between points on the perimeter of the housing connected by an imaginary line segment that passes through the center of the opening 667. In some embodiments, the width of the source 620 is in the range of about 1 cm to about 5 cm. In some embodiments, the width of the source 620 is in the range of about 1.5 cm to about 4.5 cm, or in the range of about 2 cm to about 4 cm, or in the range of about 2.5 cm to about 3.5 cm.

The individual plasma sources 620 can be powered by any suitable system used to generate a plasma. For example, in some embodiments, the sources 620 are powered by RF or microwave energy.

Figure 8A:
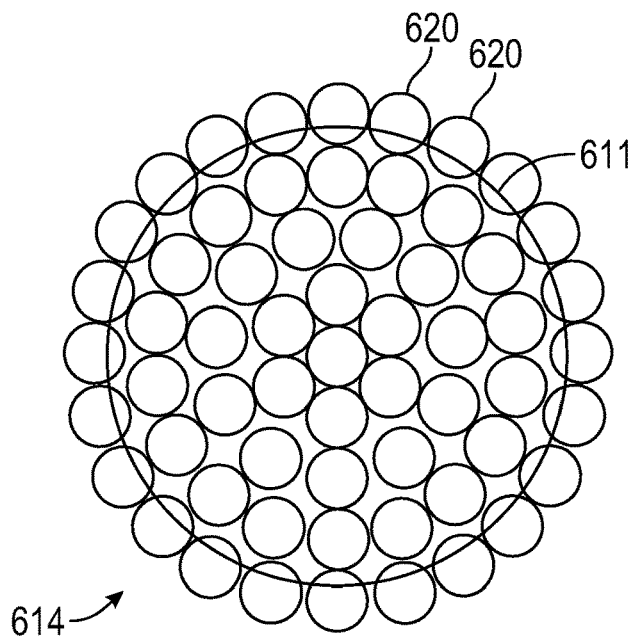
FIGS. 8A through 8C shows a schematic view of arrays of plasma sources in accordance with one or more embodiment of the disclosure.
Figure 8B:
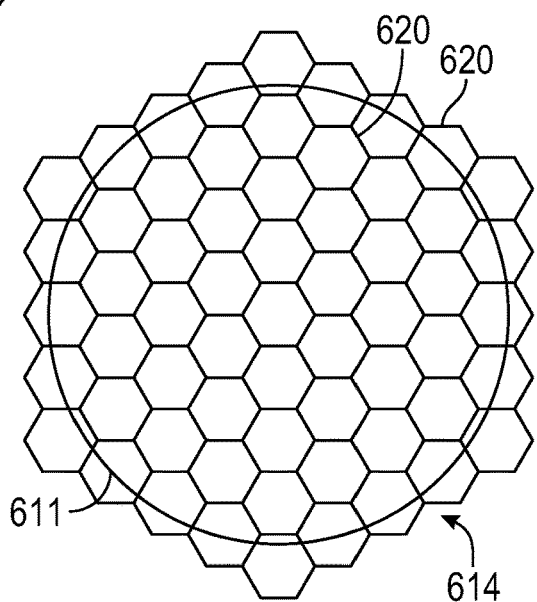
Figure 8C:
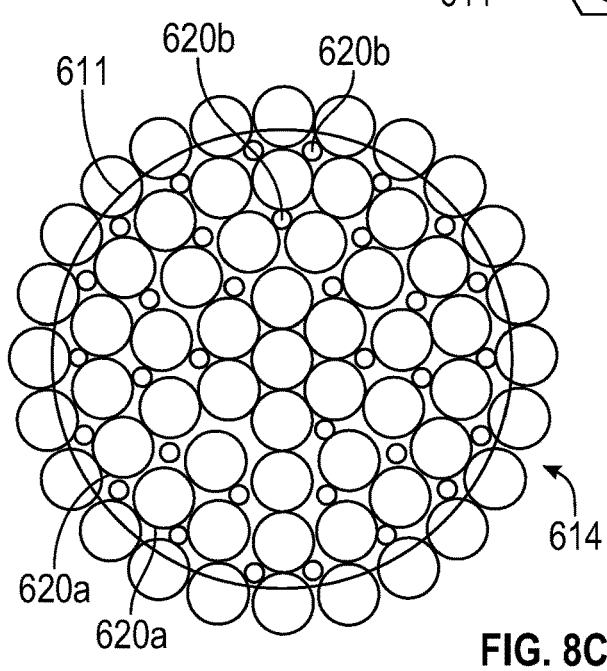

The spacing and sizes of the plasma sources 620 can be varied to pack the sources into the available space. For example, FIG. 8A shows an embodiment with round sources 620 with varying spacing. A substrate 611 is show to illustrate the shape and cover of the sources 620. FIG. 8B shows another embodiment in which hexagonal sources 620 are packed to form the plasma process region 614. FIG. 8C shows another embodiment in which there are different sized sources arranged to create the plasma process region 614. A plurality of large sources 620a is interspersed with a plurality of small sources 620b.

A controller 650 is connected to the array of individual sources 620 and to the substrate support 630. The controller is configured to monitor the position of the substrate support 630 relative to the individual sources 620. In some embodiments, the controller 650 is configured to control the movement of the substrate support 630 in addition to monitoring the position of the substrate support 630.

The controller 650 is connected to each of the individual sources 620 so that each source 620 can be independently powered or unpowered (i.e., disabled or turned off). In some embodiments, the controller 650 is configured to control zones comprising multiple sources 620.

FIG. 9A-9E show a linear plasma process region 614 in accordance with one or more embodiment of the disclosure. The linear plasma process region 614 can be used, for example, in the linear process chamber 600 illustrated in FIG. 6. The process region 614 has a first end 671 and a second end 672.

To describe one possible use of the plasma process region 614, a substrate support 630 is shown supporting a substrate 611. Other uses of the plasma process region 614 can be envisioned by those skilled in the art and are within the scope of the disclosure. The embodiment described is merely representative of one possible use. The position of the substrate support 630 is monitored so that the controller knows the location of the substrate support 630 and any substrate 611 which may be positioned thereon.

Figure 9A:
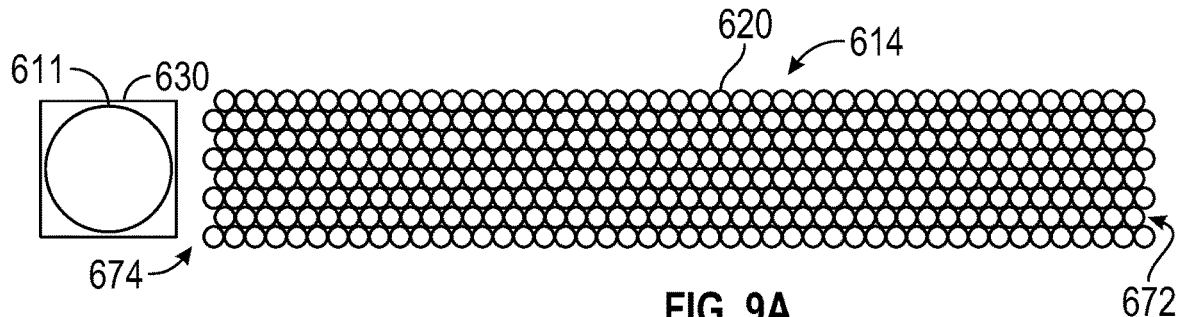
FIG. 9A through 9E shows schematic representations of a linear plasma process region during use in accordance with one or more embodiment of the disclosure.

FIG. 9A shows an initial position the substrate support 630 and substrate 611 are positioned at the first end 671 of the plasma process region 614. At this point, the controller (not shown) is not powering any of the sources 620 so that none of the plasma sources 620 are ignited. While description is made with respect to the substrate 611, it will be understood that the system can monitor the substrate support 630 position whether or not a substrate 611 is positioned thereon.

Figure 9B:
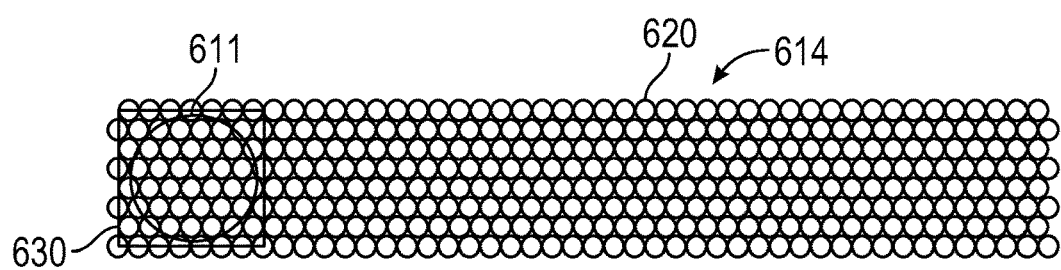
Figure 9C:
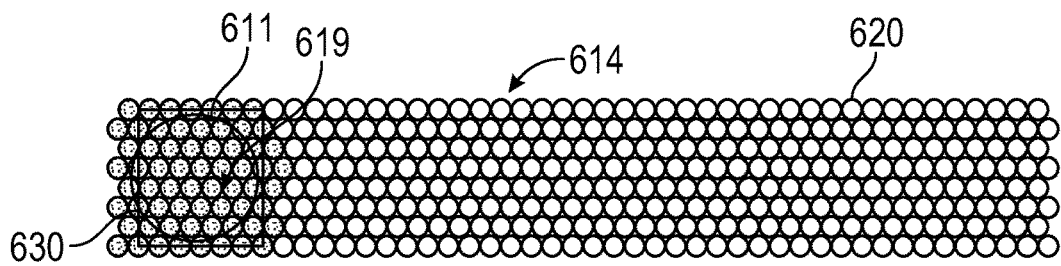

In FIG. 9B, the substrate support 630 has moved the substrate 611 under the plasma process region 614 so that the entire substrate 611 or recess sized to support the substrate is positioned adjacent the sources 620. As shown in FIG. 9C, once the substrate 611 has completely entered the plasma process region 614, the controller provides power to the individual plasma sources 620 located over the substrate 611. Because the controller 650 knows the location of the substrate support 630, the controller 650 also knows the location of recess in the substrate support configured to support a substrate or a substrate positioned on the substrate support. With the controller 650 knowing the location of the substrate support 630 and/or substrate 611, the controller 650 can ignite only the plasma sources 620 adjacent thereto and generating a plasma 619 adjacent thereto.

Figure 9D:
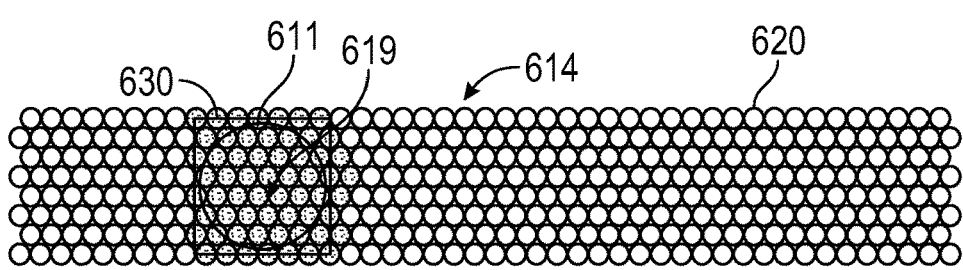
Figure 9E:
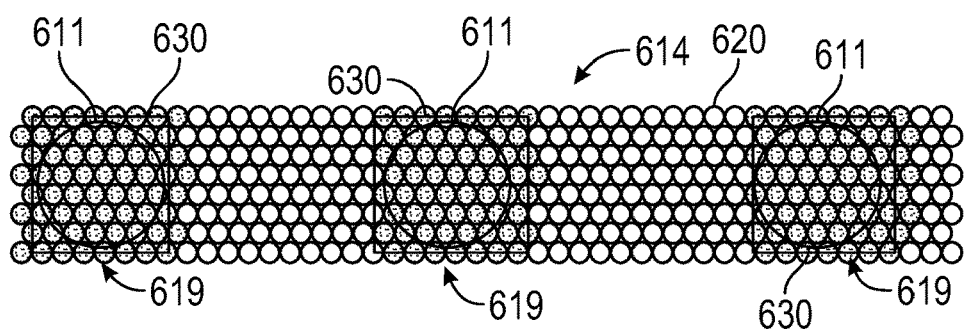

As shown in FIG. 9D, the substrate support 630 moves along a path from the first end 671 toward the second end 672 of the plasma process region 614. While moving, the controller 650 monitors the location of the substrate support 630 and ignites individual plasma sources 620 along the path of the substrate. The controller can also disable power to the individual plasma sources 620 behind the substrate as the substrate support 630 is moved along the path. In this way, a plasma 619 moves along the length of the plasma process region 614.

In some embodiments, with reference to FIG. 6, the substrate support 630 enters the processing chamber 600 through door 608a at a first end and moves through the processing chamber 600 including positions adjacent to the plasma process region 614 to exit the processing chamber 600 through a door 608b in the second end. The path traversed can be one-way or two-way or a hybrid path.

In the embodiment shown in FIG. 6E, the substrate supports 630 enter the plasma process region 614 at the first end 671 and move toward the second end 672. As each substrate support 630 enters the plasma process region 614, the controller 650 ignites a plasma 619 adjacent the substrate. For example, FIG. 6E shows three separate plasmas traveling along the length of the plasma process region 614.

In some embodiments, the substrate support 630 moves back and forth through the plasma process region 614 from the first end 671 to the second end 672. The number of passes back and forth can depend on, for example, the length of the plasma process region 614, the speed of movement and the target plasma exposure. In some embodiments, the substrate support 630 enters and exits the plasma process region 614 at the same end.

The back and forth movement can be over the entire length of the plasma process region 614 from end to end, or can be in an oscillating manner. For example, the substrate support 630 might move forward an amount, followed by some backward movement and then further forward movement. In this manner, the substrate support 630 can move some first distance forward, a second distance backward, and then repeat to move through the entire length of the plasma process region 614. In this hybrid oscillating one-way movement, the substrate can be subjected to a longer amount or greater exposure to the plasma 619 without changing the length of the plasma process region 614. The controller 650, monitoring and/or controlling this motion, can ignite and disable the individual plasma sources 620, or zones, to coincide with the movement.

As the substrate support 630 exits the plasma process region 614, the controller 650 disables the individual plasma sources adjacent the substrate support prior to the substrate leaving the plasma process region. Disabling the plasma sources above the substrate before the substrate leaves the plasma process region minimizes the chance that some of the substrate will be exposed to plasma while other portions of the substrate are not.

Figure 10A:
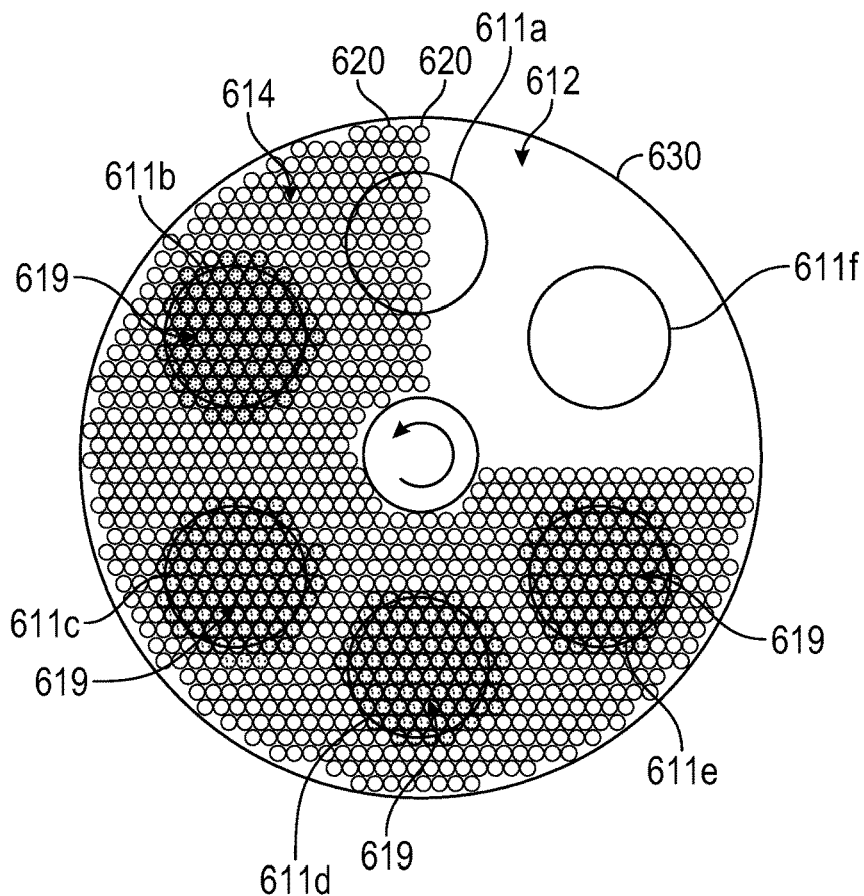
FIGS. 10A and 10B shows schematic representations of a plasma process region during use in accordance with one or more embodiment of the disclosure.
Figure 10B:
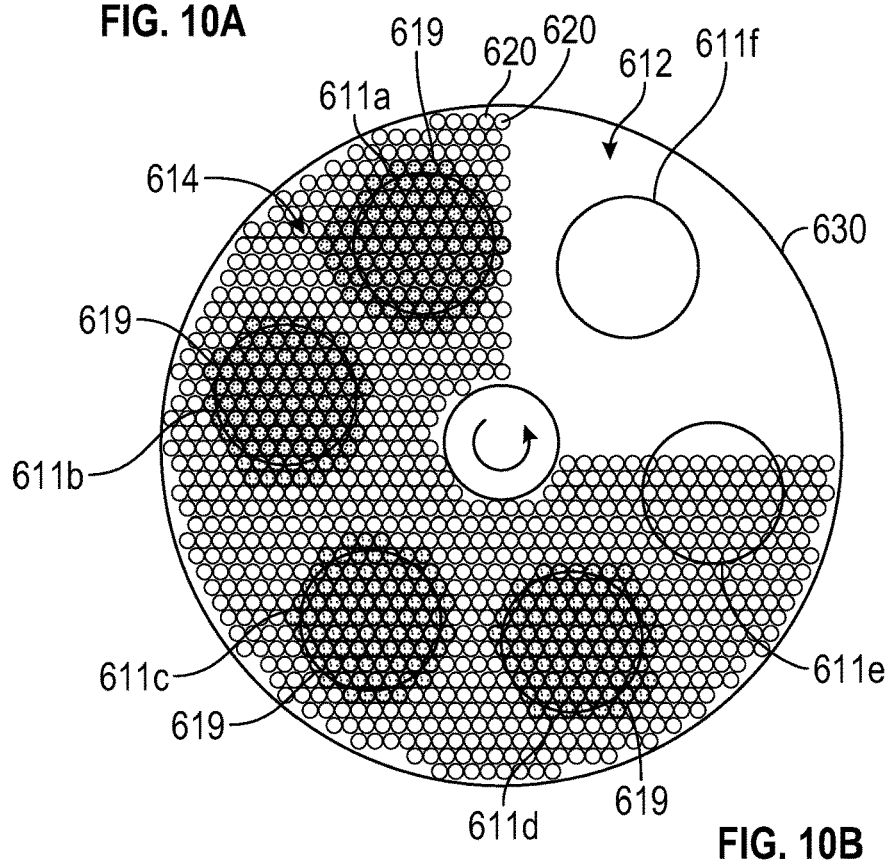

FIGS. 10A and 10B show another embodiment of the disclosure in which a circular processing chamber is used. A round substrate support 630, which may also be a susceptor assembly like that of FIG. 1, can support and move multiple substrates 611 at once. The substrates are moved in an arcuate path which can include a portion of a complete circle or multiple complete circles, depending on the amount of rotation.

In FIG. 10A, substrate 611a is positioned so that a portion of the substrate is in the thermal process region 612 and a portion is in the plasma process region 614. There are no plasma sources 620 ignited over substrate 611a. Substrates 611b, 611c, 611d, 611e are adjacent the plasma process region 614 and the sources 620 adjacent the substrates are powered generating a plasma 619 adjacent each substrate.

Substrate 611f is fully within the thermal process region 612 where there are no plasma sources 620. Other gas ports, for example, reactive gas ports, purge gas ports, vacuum ports can be positioned in the thermal process region 612 to expose the substrate 611f to various reactive and inert gases. For example, the injector unit 122 of FIG. 4 can make up the thermal process region 612 to expose the substrates to a first reactive gas and second reactive gas prior to plasma treatment in the plasma process region 614.

FIG. 10B shows the same processing chamber as FIG. 10A after the susceptor assembly (substrate support 630) has been rotated an amount counterclockwise. In the position shown, substrate 611a has fully entered the plasma process region 614 and a plasma 619 has been ignited adjacent the substrate 611a by the controller 650 powering the plasma sources 620 adjacent the substrate 611a. Substrate 611e is beginning to exit the plasma process region 614 to move into the thermal process region 612. As not all of the substrate 611e is within the plasma process region 614, the controller 650 has disabled or turned off the plasma sources 620 adjacent the substrate 611e.

The amount of the gas distribution assembly taken up by the plasma process region 614 can be varied depending, for example, on the process being performed and the length of the gas distribution assembly. In some embodiments, the plasma process region comprises more than 25% of the length of the gas distribution assembly. The length of a circular gas distribution assembly (like in FIG. 10A) is the distance that the center of the substrate or recess in the susceptor assembly travels to move in a complete circle. In some embodiments, the plasma process region comprises more than 30%, 35%, 40%, 45%, 50%, 55%, 60%, 65%, 70%, 75% or 80% of the length of the gas distribution assembly.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing chamber comprising:
    a gas distribution assembly comprising a plasma process region having a length defined by a first end and a second end and an array of individual plasma sources;
    a substrate support having at least one recess sized to support a substrate, the substrate support configured to move the at least recess along a path adjacent the gas distribution assembly through the plasma process region;
    a controller connected to the array of individual plasma sources and the substrate support, the controller configured to:
        monitor a position of the at least one recess; and
        provide or disable power to the individual plasma sources along the path, the controller providing power to the individual plasma sources adjacent the at least one recess once the at least one recess is completely within the plasma process region and disabling the individual plasma sources adjacent the at least one recess prior to a part of the at least one recess leaving the plasma process region.

2. The processing chamber of claim 1, wherein the controller is configured to provide power to the individual plasma sources over a substrate after the substrate has completely entered the plasma process region.

3. The processing chamber of claim 1, wherein the controller is configured to move the substrate through the plasma process region along the path.

4. The processing chamber of claim 3, wherein the controller is configured to provide power to the individual plasma sources ahead of the substrate along the path and disable power to the individual plasma sources behind the substrate as the substrate moves along the path.

5. The processing chamber of claim 1, wherein the controller is configured to disable power to any individual plasma source above the substrate before the substrate exits the plasma process region.

6. The processing chamber of claim 1, wherein the chamber is circular and the path is an arcuate path.

7. The processing chamber of claim 6, wherein the plasma process region comprises more than half of the gas distribution assembly.

8. The processing chamber of claim 6, wherein the gas distribution assembly further comprises a thermal processing region.

9. The processing chamber of claim 8, wherein the gas distribution assembly further comprises a gas curtain between the thermal processing region and the plasma processing region.

10. The processing chamber of claim 1, wherein the chamber is linear.

11. The processing chamber of claim 10, wherein the substrate support enters the processing chamber at a first end and moves through and exits the processing chamber through a second end.

12. The processing chamber of claim 11, wherein the substrate support oscillates while traveling from the first end to the second end.

13. The processing chamber of claim 10, wherein the substrate is moved back and forth through the processing chamber to enter and exit from a same end of the chamber.

14. The processing chamber of claim 1, wherein each individual plasma source has an opening defining a width of the individual plasma source, the individual plasma sources independently having a width in the range of about 1 cm to about 5 cm.

15. The processing chamber of claim 1, wherein each of the individual plasma sources are RF or microwave powered.

16. A processing chamber comprising:
a circular gas distribution assembly comprising a thermal process region and a plasma process region with an array of individual plasma sources, the plasma process region having a first end and a second end defining a length, the length comprising greater than or equal to about half of the gas distribution assembly, each of the individual plasma sources having an independent width in the range of about 1 cm to about 5 cm;
a susceptor assembly positioned adjacent the circular gas distribution assembly, the susceptor assembly having a top surface with a plurality of recesses to support a plurality of substrates, the susceptor assembly rotatable about a central axis to move the substrates in an arcuate path adjacent the gas distribution assembly;
a controller connected to the array of individual plasma sources and the susceptor assembly, the controller configured to:
monitor a position of the plurality of recesses in the susceptor assembly; and
provide power or disable power to each of the individual plasma sources, the controller providing power to the individual plasma sources over a recess of the plurality of recesses after the recess has completely entered the plasma process region, providing power to the individual plasma sources ahead of the recess during movement of the recess along the path, disabling power to the individual plasma sources behind the recess during movement of the recess along the path, and disabling power to individual plasma sources adjacent the recess prior to a part of the recess leaving the plasma process region.

* * * * *